(12) United States Patent
Carichner et al.

(10) Patent No.: US 7,288,987 B2
(45) Date of Patent: *Oct. 30, 2007

(54) RF AMPLIFIER EMPLOYING ACTIVE LOAD LINEARIZATION

(75) Inventors: Scott Carichner, Santa Margarita, CA (US); Nikolai Maslennikov, Huntington Beach, CA (US); Ryan Henry, Tustin, CA (US); Ahmad Khanifar, Laguna Hills, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/372,595

(22) Filed: Mar. 10, 2006

(65) Prior Publication Data

US 2006/0238245 A1 Oct. 26, 2006

Related U.S. Application Data

(63) Continuation-in-part of application No. 10/837,838, filed on May 3, 2004, now Pat. No. 7,038,539.

(60) Provisional application No. 60/468,309, filed on May 6, 2003.

(51) Int. Cl.
 *H03F 1/14* (2006.01)
(52) U.S. Cl. .................... 330/136; 330/51; 330/124 R
(58) Field of Classification Search ................ 330/51, 330/124 R, 136, 286, 295
See application file for complete search history.

(56) References Cited

U.S. PATENT DOCUMENTS 5,757,229 A * 5/1998 Mitzlaff .................. 330/124 R
6,496,061 B1 * 12/2002 Bloom et al. ........... 330/124 R

* cited by examiner

*Primary Examiner*—Khanh Van Nguyen
(74) *Attorney, Agent, or Firm*—Myers Dawes Andras & Sherman LLP

(57) ABSTRACT

A power amplifier system for high efficiency signal amplification of digitally modulated carrier signal or multi-carrier signals is disclosed. The linearity of the amplifier is improved by providing dynamic load line adjustments through implementation of suitably defined transfer functions employing dynamic control of operational aspects of active devices in the power amplifier.

19 Claims, 13 Drawing Sheets

RF AMPLIFIER EMPLOYING ACTIVE LOAD LINEARIZATION

RELATED APPLICATION INFORMATION

The present application is a continuation in part of application Ser. No. 10/837,838 filed May 3, 2004, now U.S. Pat. No. 7,038,539 which claims priority under 35 USC section 119(e) to provisional application Ser. No. 60/468,309 filed May 6, 2003, the disclosures of which are incorporated herein by reference in their entirety.

BACKGROUND OF THE INVENTION

1. Field of the Invention

The present invention is related to radio frequency (RF) amplifiers. More particularly, the present invention is related to radio frequency power amplifiers used in wireless communication applications such as cellular base stations where signals with high peak to average ratios are generated and amplified.

2. Description of the Prior Art and Related Background Information

Most digitally modulated carrier signals used in modern telecommunication systems have an amplitude envelope showing a large peak to average ratio. In such systems, to preserve signal integrity and prevent transmitter spurious emissions, the amplifying device has to maintain linearity by having sufficient headroom for the signal peaks, albeit producing a modest average output power and therefore having a low efficiency. Hence, the amplifier efficiency and its linearity are practically mutually exclusive.

Even from the early days of AM broadcasting and in more recent complex transmission systems such as satellite communications, cable TV applications and cellular telephony, the carrier amplifiers have been mostly used in conjunction with some means of linearization to achieve the required performance. Feedback and in RF frequency bands, feedforward linearization are widely used linearization techniques. Analog predistortion has been used since the early days of satellite communication where frequency division multiple access (FDMA) systems were employed for sharing transponder bandwidth. In recent years, with the advent of digital signal processing (DSP), digital predistortion has received much attention.

Nonetheless, despite the significant efforts directed to linearization of RF power amplifiers, such techniques typically come at the expense of amplifier efficiency. Therefore, it is desirable to have additional techniques to achieve linearity and improve efficiency in RF amplifiers. Also, it is desirable to provide linearization techniques which may have reduced costs compared to the above known techniques, or which may improve performance, employed alone or in combination with the above techniques.

SUMMARY OF THE INVENTION

In a first aspect the present invention provides a power amplifier circuit comprising an input for receiving an input signal, and a coupler for receiving the input signal and splitting the input signal on two signal paths. A first amplifier device is coupled to the coupler on a first of the two signal paths and receives the input signal and provides a first amplified signal, the first amplifier device having a first turn on threshold. A second amplifier device is coupled to the coupler on a second of the two signal paths and receives the input signal and provides a second amplified signal, the second amplifier device having a second turn on threshold and an impedance near zero when the input signal is below the turn on threshold. An output load is coupled to the first and second amplifier devices. The power amplifier circuit further comprises a DC power supply. A first bias circuit is coupled to the first amplifier device and the DC power supply and provides a first bias to the first amplifier device setting the first turn on threshold of the first amplifier device. Bias control means, coupled to the second amplifier device and the DC power supply, provides a second bias to the second amplifier device setting the second turn on threshold of the second amplifier device at a substantially higher level than the first turn on threshold, the second turn on threshold corresponding to a peak power region of the input signal. The power amplifier circuit further comprises an output coupled to the first and second amplifier devices via the output load and providing an amplified output signal.

In a preferred embodiment of the power amplifier circuit the bias control means controls the second bias through a bias class transition of the second amplifier device from Class C to Class AB/B. The bias control means is preferably adjustable to control the rate of change of conduction angle of the second amplifier device. Also, the bias control means preferably controls the second bias to the second amplifier device as a function of temperature. The bias control means may also control the bias class transition point of the second amplifier device as a function of temperature. In a preferred embodiment of the power amplifier circuit the circuit further comprises phase control means coupled between the input and the second amplifier device for controlling the phase of the input signal in response to the input signal envelope. The phase control means preferably provides a first direction of phase adjustment in a first input signal envelope power region and a second opposite direction of phase adjustment in a second input signal envelope power region. Also, the phase control means may compensate for phase variation introduced by the bias control means.

According to another aspect the present invention provides a radio frequency power amplifier system comprising an RF input port for receiving an RF input signal, an RF output port for providing an amplified output signal in response to the input signal, a power divider network having an input port coupled to the RF input port and first and second output ports. A first signal delay element, having an input port and an output port, is coupled to the first output port of the power divider network. A first amplifier, having an input port and an output port is coupled to the output port of the delay element. The power amplifier system further comprises a directional coupler, having an input port coupled to the second output port of the power divider network, a through port and a coupled port, and a continuously variable phase shifter for controlling insertion phase, the phase shifter having an input port coupled to the through port of the directional coupler and an output port. The power amplifier system further comprises a second amplifier having an input port coupled to the output port of the phase shifter. The power amplifier system further comprises a linear envelope detector network having an input port coupled to the coupled port of the directional coupler and an output port, wherein the envelope detector output port provides signals responsive to the envelope of the input RF signal. The power amplifier system further comprises conduction angle control means, having at least one input port and a plurality of output ports, for generating a plurality of different conduction angle control functions, wherein the conduction angle control functions are responsive to the RF signal envelope applied to the RF power amplifier. The power amplifier system further comprises a dynamic signal combiner network having first and second input ports and an output port, wherein the output port of the first amplifier is coupled to the first input port of the dynamic signal combiner network, the output port of the second amplifier is coupled to the second input port of the dynamic signal combiner network, and the output port of the signal combiner network is coupled to the RF output port.

In a preferred embodiment of the radio frequency power amplifier system the phase shifter is responsive to a first output port of the conduction angle control means, wherein the first output provides an insertion phase control signal. In a preferred embodiment of the radio frequency power amplifier system the second output of the conduction angle control means is functionally coupled to control the bias of the second power amplifier. In a preferred embodiment of the radio frequency power amplifier the first RF power amplifier is a main RF power amplifier and the second RF power amplifier is an auxiliary RF power amplifier. In a preferred embodiment of the radio frequency power amplifier the conduction angle control means provides the control signals as a function of temperature.

According to another aspect the present invention provides a method for linear and efficient amplification of an RF input signal. The method comprises receiving an RF input signal and sampling the input signal to provide a sampled input signal. The method further comprises amplifying the input signal with a first amplifier device and applying the amplified signal across a load to provide an output signal. The method further comprises amplifying the sampled input signal with a second amplifier device and applying the amplified sampled input signal to the output load in parallel with the amplified signal. The method further comprises dynamically varying the impedance of the second amplifier device from a first substantially constant impedance near zero value over the lower major portion of the input signal power range to a second higher impedance in a peak power range of the input signal to substantially reduce the load of the first amplifier device when the input signal approaches the peak power region, while maintaining the load substantially constant over the lower major portion of the input signal power range.

According to a preferred embodiment of the method for linear and efficient amplification of an RF input signal, dynamically varying the impedance of the second amplifier device comprises dynamically varying the bias class of the second amplifier device from a first bias class in a lower portion of the input signal power range to a second bias class in a higher power range of the input signal. In particular, the first bias class is preferably Class C and the second bias class is Class AB or B. In a preferred embodiment of the method the transition between the first and second bias class is controlled as a function of temperature. The method preferably further comprises controlling the phase of the input signal as a function of input signal power.

Further features and advantages of the present invention will be appreciated from the following detailed description of the invention.

DETAILED DESCRIPTION OF THE INVENTION

The present invention provides a linearized high efficiency RF power amplifier and a method for linear amplification of an RF signal. A detailed circuit schematic of a first embodiment of the amplifier is shown in FIG. 3, described below. First, however, the basic operational characteristics of amplifier devices employed in such circuit will be described in relation to FIG. 1 and FIG. 2.

Figure 1:
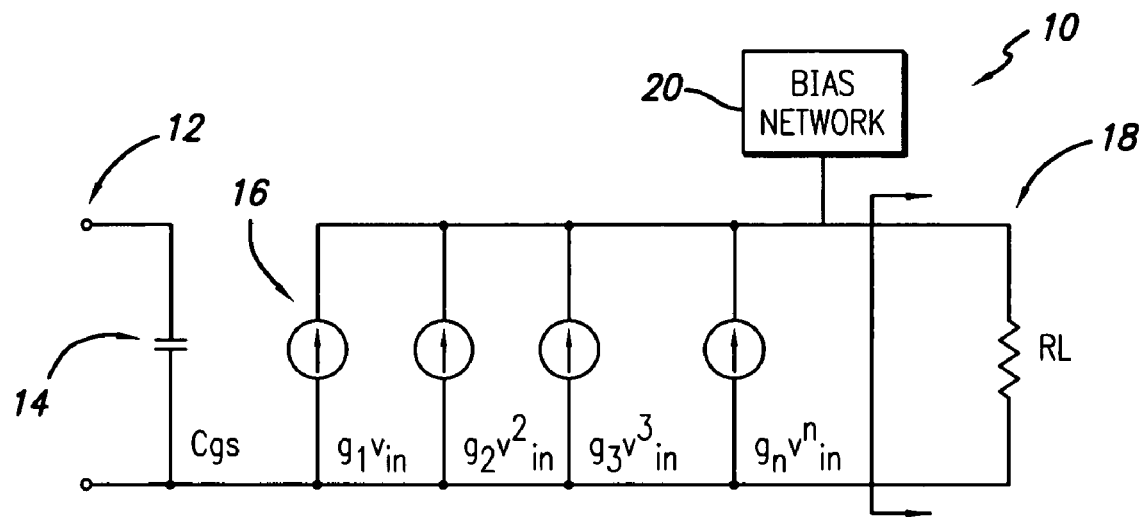
FIG. 1 is a schematic representation of a voltage controlled current source.

The basic structure of a controlled current source as embedded in an amplifier circuit 10 is shown in FIG. 1. This structure is a representation of a voltage controlled current source and is a simplified representation of solid-state devices such as a Field Effect Transistor (FET). The mechanisms responsible for the active device (transistor) nonlinearity are multifold. The device transconductance, the input and the output nonlinearities, all contribute to the amplifier distortion and are well known to those skilled in the art. The following description of the invention is equally applicable to other devices such as bipolar transistor technology.

Referring to FIG. 1, the amplifier circuit 10 includes a bias network 20 coupled to an active device which may be modeled as a plurality of current sources 16. An input signal $v_{in}$ is applied to input 12 and an output is provided via output load 18. The parasitic gate to source capacitance 14 is also shown. In this simple model of the device, the drain to source current is given by:

$$I_{DS}=g_1 v_{in}+g_2 v^2_{in}+g_3 v^3_{in}+ \ldots +g_n v^n_{in} \quad (1)$$

In this near-ideal representation of the active device, the output power limitation is caused by the drain saturation current ($I_{DSS}$), which is a device physical limitation, and also the load resistance, once the device is embedded in an amplifier circuit. The point where the drain saturation current is reached is thus determined by $v_{in}$ assuming a fixed load 18.

In an amplifying circuit, the signal distortion is most pronounced when the device is driven into the saturation region by large $v_{in}$. That region is where the output signal will be clipped causing severe signal distortion. This situation arises when the RF voltage (the current supplied by the active device multiplied by the load value) exceeds the dc supply rail. Although in such mode of operation, the amplifier is very nonlinear, its efficiency is high. Hence, in applications with large signal envelope, the amplifier is normally operated in the back off region to avoid distortion, and therefore, its efficiency is fairly low.

The present invention provides an approach to amplifier linearization, where, for a given input excitation, the load value is dynamically changed and controlled by the envelope of the modulated signal. In this fashion, output clipping is avoided.

Figure 2:
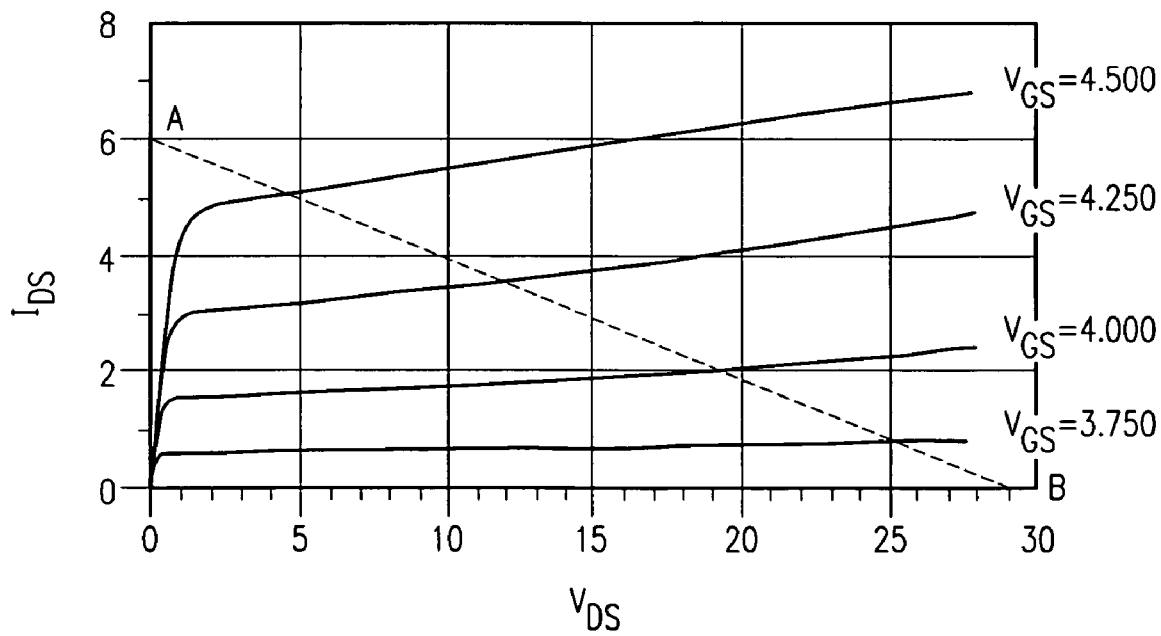
FIG. 2 is a graphical representation of current vs. voltage characteristics of an amplifier device showing the amplifier load line.
Figure 3:
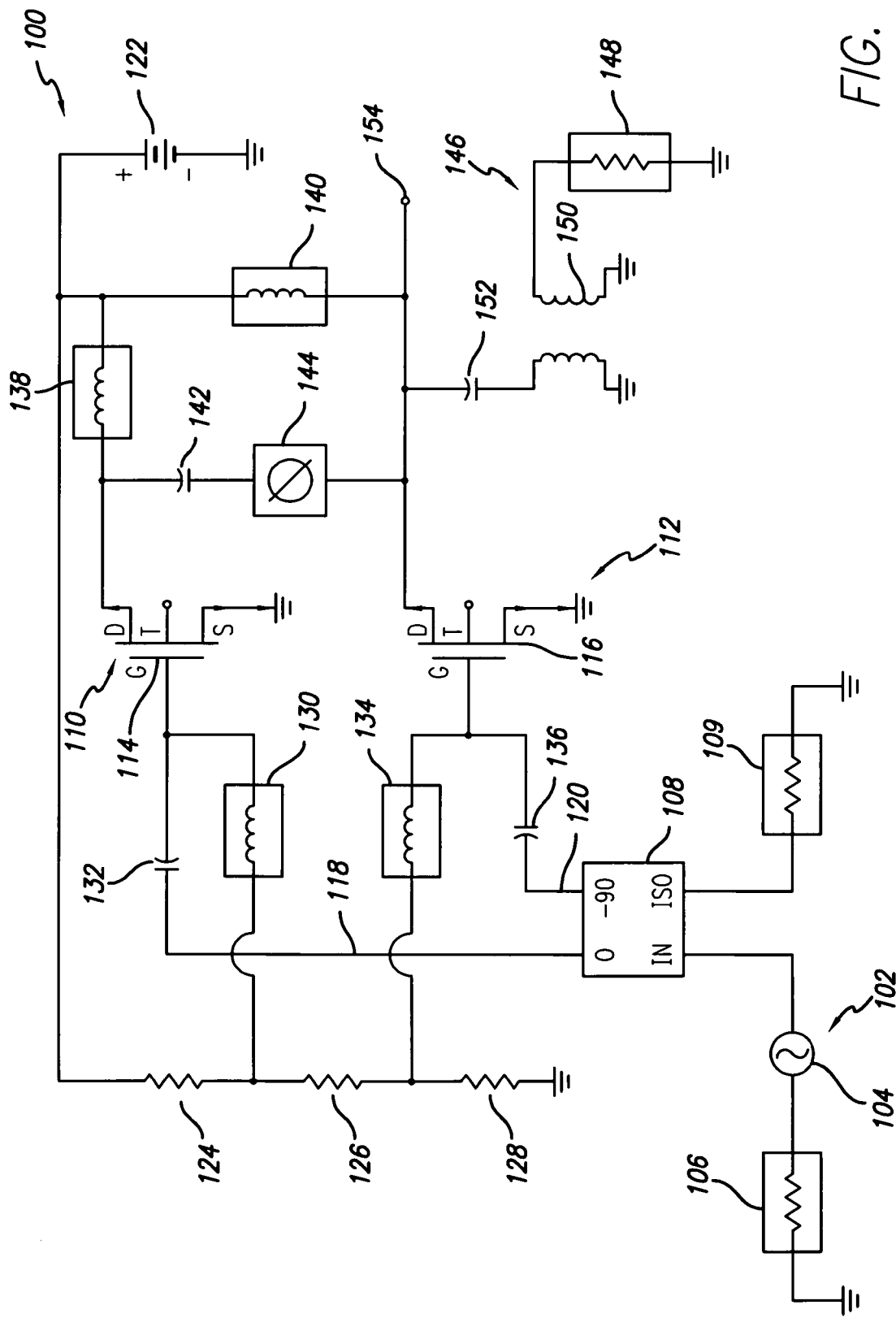
FIG. 3 is a schematic drawing of an amplifier circuit in accordance with one embodiment of the invention.

In FIG. 2, the drain to source current $I_{DS}$ for a typical FET solid state device is shown as a function of drain to source voltage $V_{DS}$ for various gate to source voltages $V_{GS}$. The line AB is determined by the output load 18 (shown in FIG. 1). In accordance with the present invention, the slope of line AB (the load line) is changed dynamically and in tune with the envelope of the carrier signal. When the envelope is small, the load is set to be larger than the nominal value to generate a larger RF voltage swing, just short of dc rail. This leads to an improvement of the dc to RF conversion efficiency. As signal envelope is increased, dynamic load pulling reduces the load to avoid distortion.

The power added efficiency η, as known to those skilled in the art, is defined as:

$$\eta=(\text{output RF power}-\text{input RF power})/\text{dc input} \quad (2)$$

In class AB mode of operation, the dc power ($I_{DS} \times V_{DC}$) is dependent on quiescent current, and the efficiency of such amplifier is improved by maximizing the RF power in back off and this can be achieved by increasing the amplifier load. However, this will lead to nonlinearity and severe distortion at higher input levels. Therefore, when the input signal envelope goes through its peaks, the RF load will have to be reduced to prevent output clipping and maintain fidelity.

The linearization method of the present invention provides such a load pulling mechanism. A preferred implementation achieves this task by using a $2^{nd}$ current source (solid state device) that is activated to adjust the load dynamically, in accord with the signal envelope and avoids the output signal hitting the dc rail. One specific circuit implementation employing dynamic adjustment of the amplifier ac load line is schematically shown in FIG. 3.

Referring to FIG. 3, the amplifier circuit 100 includes an input 102 for receiving an RF input signal. The input signal is provided by input signal source 104 applied to the input and an input load 106. This input signal is divided into two paths 110, 112 by coupler 108, which may be a 90 degree hybrid coupler (HYB) with an isolation port coupled to a termination load 109. The signal on main path 110 is applied along line 118 to a main amplifying device 114 via capacitor 132, which is a dc block. In this implementation a radio frequency MOS device 114, such as an LDMOS device is being used as the main amplifier device. A first bias circuit comprising the network of resistors 124, 126, 128 (values $R_2$, $R_3$ and $R_4$) supply the required gate bias to amplifier device 114 from DC power supply 122. These resistor values are adjusted to operate the device preferably in class A or AB mode of operation. DC feed circuit 130 acts as a low pass filter to stop the RF signal from leaking into the dc lines.

The power supply to the main amplifier device is provided from power supply 122 via DC feed circuit 138 which also blocks RF signals from the DC feed lines. The output of main amplifier device 114 is connected to output load 146 via phase shifter (PS) 144. Load 146 may comprise a conventional fixed load 148 and an inductive load 150, shown by a schematic representation of an RF transformer (TF). The role of the phase shifter 144 and its functionality will be discussed shortly. DC blocking capacitors 142, 152 are also shown. The combination of the inductive load 150 and the phase shifter 144 transform the load impedance of fixed load 148 into an appropriate level. Impedance scaling by a factor of k (1.5<k<3 larger than the nominal load value) will be suitable for typical applications. The load value seen by main amplifier device 114 will cause amplifier output clipping to happen at typically 6-10 dB input back off from device saturation. Hence, at this region, large output voltage swings are possible and high efficiency will be the result. Nonetheless, beyond this point, the amplifier output clipping leads to severe distortion if the load impedance value remains high. To avoid output clipping, the load of the main amplifier device is reduced as signal envelope increases.

Still referring to FIG. 3, a sample of the RF input is derived via input directional coupler 108 and provided to the second (auxiliary) signal path 112. The sampled signal is amplitude adjusted and phase conditioned to the appropriate level before it is combined with the main amplifier device current. More specifically, in the illustrated preferred embodiment the sampled input signal is provided to second (auxiliary) amplifier device 116 along line 120 via DC blocking capacitor 136. A second bias circuit comprising resistor network 124, 126, 128 coupled to DC power supply 122 sets the turn-on threshold of auxiliary amplifier 116. DC feed line 134 acts as a low pass filter blocking RF energy from the DC feed lines. The current produced by the auxiliary amplifier device is thus proportional to the envelope of the signal, i.e. this device will only supply current to the load 146 above a certain input threshold (e.g., 6-10 dB back off). The current from auxiliary amplifier device 116 is combined with the main device 114 output current before it is applied to output device 146. The addition of this (envelope controlled) current to the load results in the dynamic control of the load. The role of the phase shifter 144 is to introduce phase change and impedance inversion. Therefore, above the turn-on threshold of device 116, the load impedance experienced by device 114 is reduced. As a result linearization of the main amplifier device 114 is achieved by avoiding output clipping. The load current is thus composed of two in-phase components leading to higher peak power at amplifier output 154 resulting in improved overall efficiency at back off.

In FIG. 3, the two amplifying devices 114, 116 will normally be used with input and output matching circuits. The inclusion of distributed or lumped matching circuits will introduce phase changes, leading to load impedance inversions. In such circumstances, the role of devices 114, 116 may need to be exchanged, but the principle of operation remains unchanged.

Figure 4:
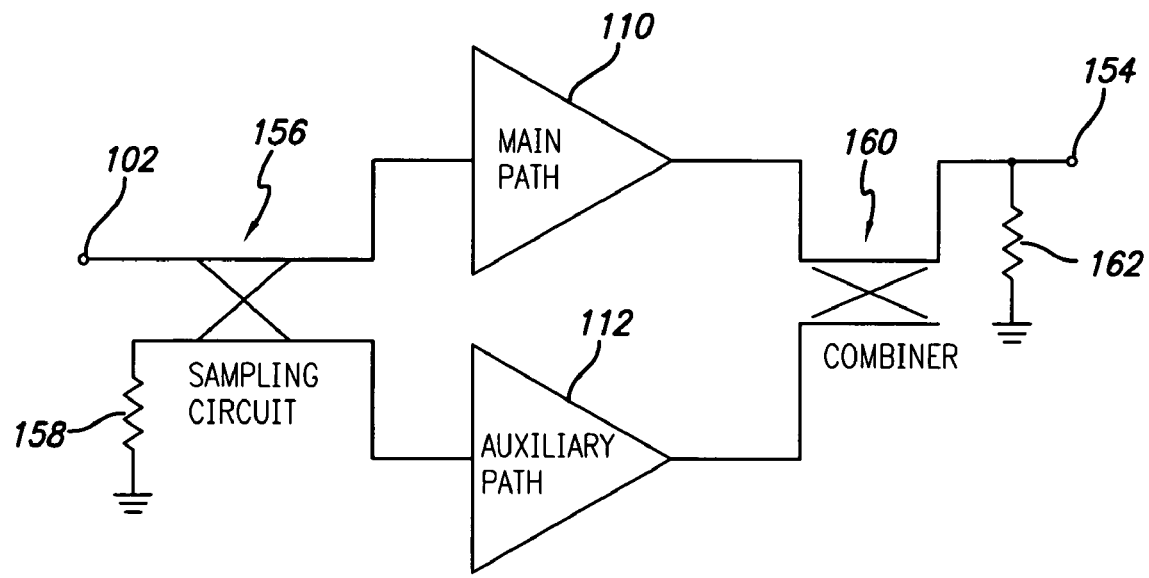
FIG. 4 is a schematic drawing of an alternate embodiment of the invention employing combiner circuitry at the RF frequency range.
Figure 5:
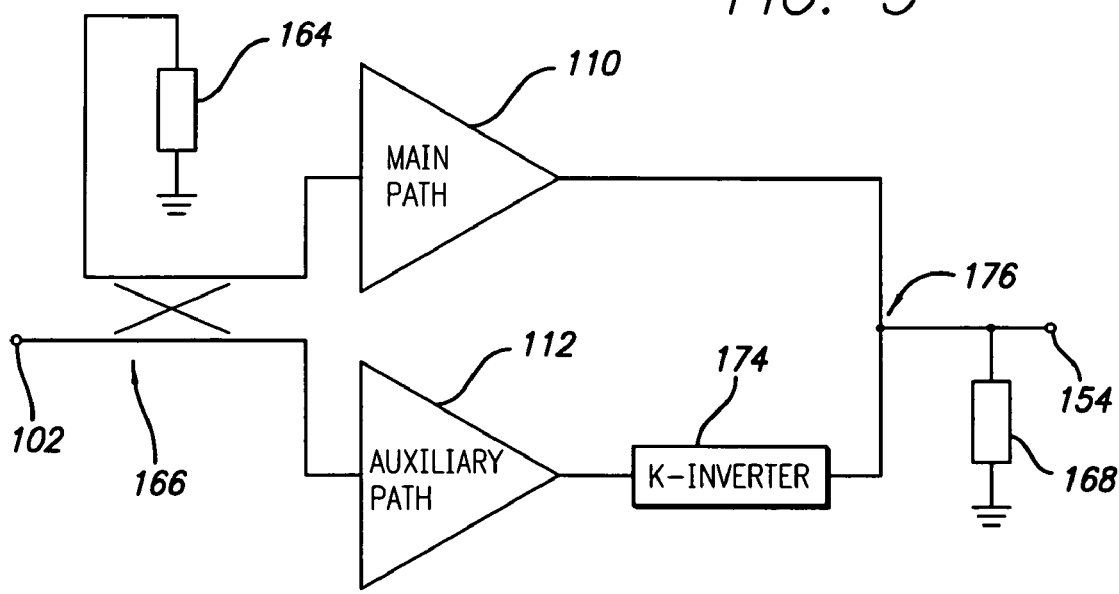
FIG. 5 is a schematic drawing of another embodiment of the invention employing an alternative amplifier combining arrangement.

FIGS. 4 and 5 depict alternative embodiments employing other combining arrangements. In the embodiments of FIGS. 4 and 5, as in the embodiment of FIG. 3 the signal in the auxiliary path is combined with the main path to provide dynamic load adjustment as described above.

In the embodiment of FIG. 4, an RF input signal is applied to input 102 and provided to sampling circuit 156, including termination load 158. Sampling circuit 156 may be any suitable sampling circuit known to those skilled in the art, including a hybrid coupler as described in relation to FIG. 3. The input signal and sampled input signal are provided along main and auxiliary paths 110, 112, respectfully, as in the embodiment of FIG. 3. An RF combiner 160 is then employed to combine the two signal paths and the output signal is provided to output 154 via RF load 162. The RF combiner 160 may be any suitable RF combiner of a type known to those skilled in the art. In this realization, the two arms are designed to have different transfer characteristics. While the main amplifier is designed to have a load for maximum efficiency at some back off signal level (6-10 dB), the 2nd amplifying branch is designed to have maximum peak power at full power.

In the embodiment of FIG. 5, the input signal at input 102 is similarly sampled by sampling circuit 166, including termination load 164, and provided along main and auxiliary paths 110, 112 to combiner 176 and to output 154 via RF load 168. The arrangement shown in FIG. 5 can offer broadband response and ease of implementation. In this configuration the required phase shift between auxiliary path 112 and main path 110 is provided by a K-inverter 174, for example as described in Matthaei G., Young L. and Jones E. M. T., Microwave Filters, Impedance Matching, and Coupling structures, Artech House, ISBN: 0-89006-099-1, the disclosure of which is incorporated herein by reference.

For both the embodiments of FIGS. 4 and 5, as well as FIG. 3, the addition of the auxiliary arm output to the main signal path is equivalent to lowering the impedance of the load or to a change in the slope of the load line (FIG. 2). It should be noted that provided that a good phase balance is preserved between the main signal path and the auxiliary path, the power delivered to the load will be enhanced. Therefore, for all practical purposes, the circuit is configured to have a load impedance value, presented to the active device in the main path that is large compared to nominal load value. This load is gradually reduced, as the signal envelope increases above a threshold, and therefore, the device in the main path is loaded with an optimum load to avoid distortion. By decreasing the load at high input signal levels, the amplifier output voltage swing is lowered, preventing the excessive nonlinearity which would be the result otherwise. The control circuitry can take different forms and one mechanism for the control of the two current sources in the two signal paths is the bias of each stage as described above. As the main device will have to be active at lower envelope power levels, it will preferably be biased at class A or AB. The device in the auxiliary arm will be biased with smaller quiescent current, in which case, the drive signal level can turn this device on and allow the current to flow across the device and into the load. Other approaches to the control of the two current sources in the two signal paths may also be employed, however. For example, the envelope of the input signal can be extracted by using an envelope detector circuit. This information can be used for the control of the second current source in the auxiliary path 112.

Figure 6A:
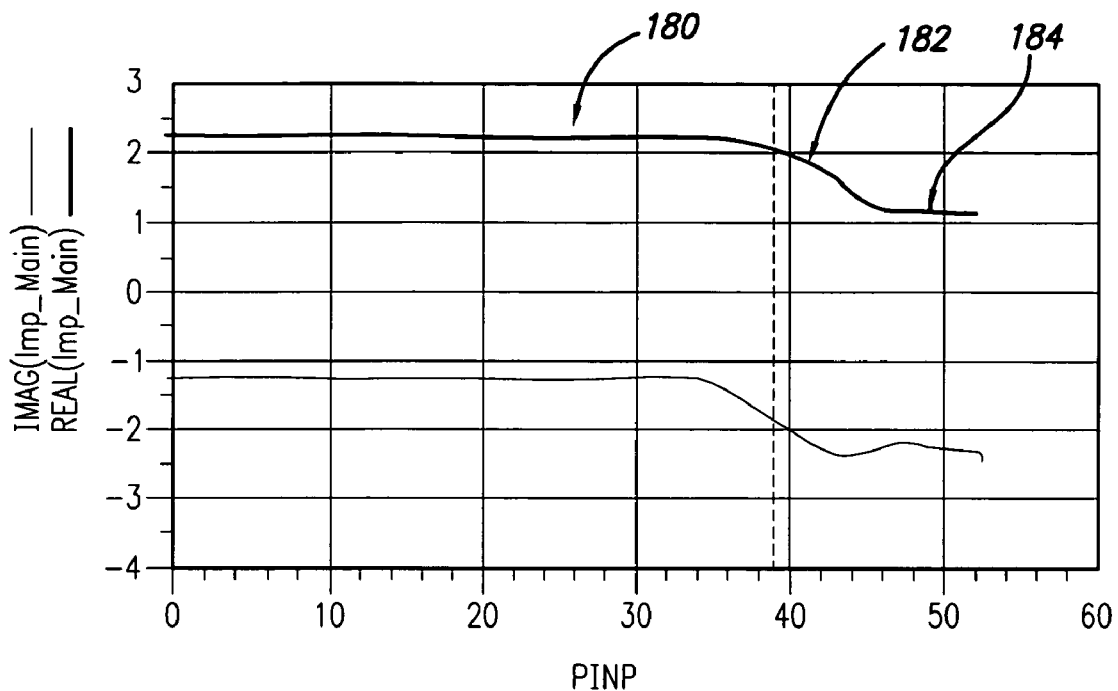
FIG. 6A is a graphical illustration of the load dynamics across the main amplifier device in the embodiment of FIG. 3.
Figure 6B:
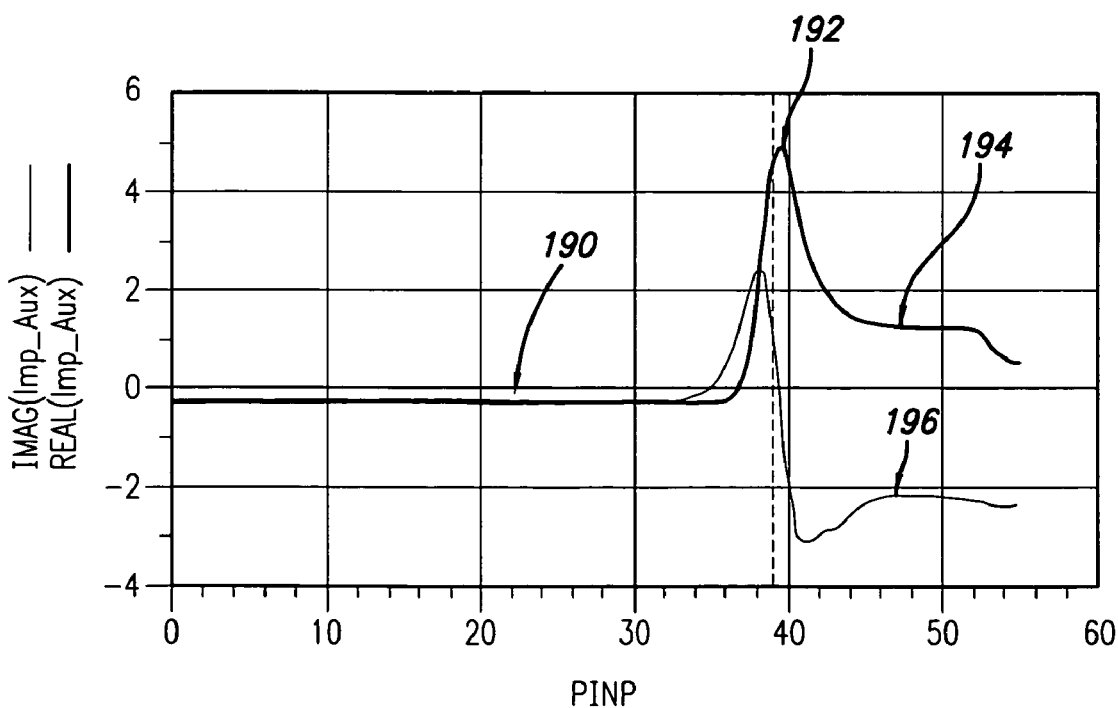
FIG. 6B is a graphical illustration of the load dynamics across the linearizing device in the embodiment of FIG. 3.

Referring to FIGS. 6A and 6B the results from a computer modeling of the circuit of FIG. 3 showing the dynamics of load variation with signal level are illustrated. FIGS. 6A and 6B show the real and imaginary components of the impedance across the main and auxiliary amplifier devices, respectfully, as a function of input signal power (in dBm). FIG. 6A shows that the real part of the load impedance is larger at the lower power region 180, and it drops through a transitional region 182 as the input signal level is increased above the turn-on threshold (dashed line) of the auxiliary device and the load pulling is activated. The main device impedance then stabilizes at a substantially lower real part of impedance value (e.g. about 50% of maximum impedance) at a higher power region 184. As shown in FIG. 6B, in the auxiliary signal path the load impedance measured across the auxiliary device terminal is approximately zero (but looks slightly negative) in the region 190 when the auxiliary device is inactive, i.e., below the turn-on threshold (dashed line). This is indicative of the fact that this device absorbs very small RF power in this mode (this loss of output power is outweighed by the improvements of main path efficiency). As the input signal level is increased, the auxiliary device is turned on and starts supplying current into the load. At some intermediate level, a relatively large impedance 192 is observed across the auxiliary device (little or no current flow into the $2^{nd}$ arm). At larger powers, the load impedance observed by the $2^{nd}$ arm stabilizes in region 194. The auxiliary device impedance in region 194 is substantially the same as the impedance value experienced by the main arm in region 184. In this region the imaginary component of the auxiliary device impedance 196 is negative. The comparison of the two graphs 6A and 6B thus shows that the load across the main device is dynamically changed (reduced) to improve the linearity and prevent output clipping/distortion.

Figure 7:
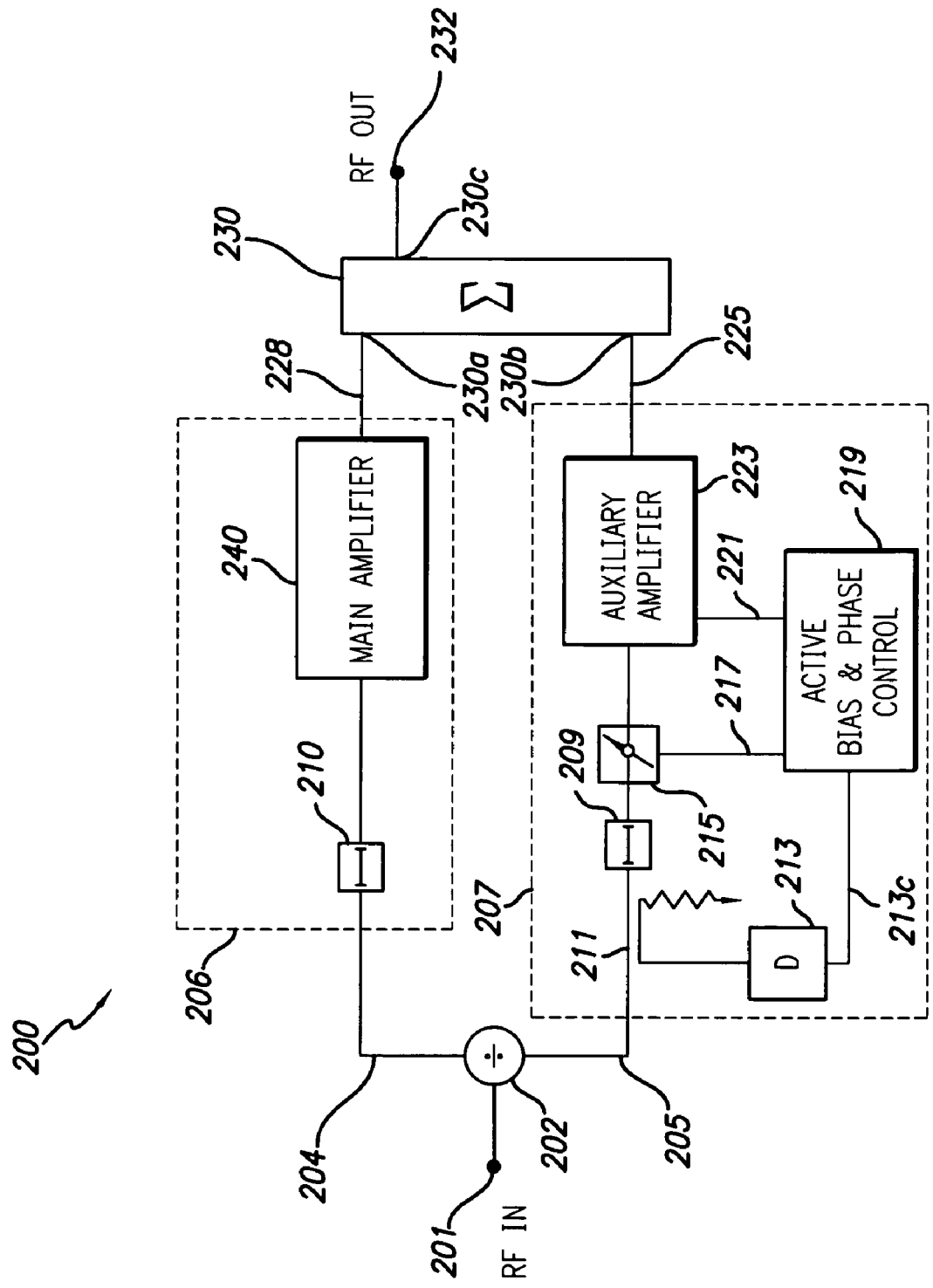
FIG. 7 is a schematic drawing of another embodiment of the amplifier of the present invention.

Referring to FIG. 7 an exemplary RF power amplifier system 200 according to another embodiment of the present invention is illustrated. Input port 201 receives input RF signals to be amplified. A conventionally constructed radio frequency power splitter 202 having first 204 and second 205 outputs provides input signal splitting along first (main) and second (auxiliary) signal paths 206, 207. Those skilled in the art will appreciate that various implementations can be used for power splitter 202.

The first output 204 of the power splitter 202 is coupled to first (conventional) delay element 210 in the main amplification section 206. First delay element 210 is used to equalize group delay between the main section 206 and auxiliary section 207. The output port of the first delay element 210 is coupled to the input port of the main amplifier module 240. It shall be understood that depending on the intended application any suitably constructed radio frequency power amplifier can be employed in main amplifier module 240 or auxiliary amplifier module 223. In certain cases it may be advantageous to utilize multi-stage amplifiers with a plurality of gain stages, however, these design decisions among other details, as can be appreciated by those skilled in the art, are dependent on the specific design constraints or performance aspects that may govern actual implementation. The output 228 of main amplifier module 240 is coupled to the first input port 230a of a combiner 230 which is preferably a low loss dynamic signal combiner network.

The second output 205 of the power splitter 202 is coupled to the input port of directional coupler 211 which may be of a conventional construction. The output (or through) port of directional coupler 211 is coupled to the input port of a second delay element 209. The output port of the second delay element 209 is coupled to a phase shifter 215. The coupled port of the directional coupler 211 is coupled to a high-speed envelope detector circuit 213. The output 213c of the high-speed envelope detector circuit 213 is coupled to bias and phase control circuit 219 that provides biasing control signals 221 to the auxiliary amplifier 223, as well control signals 217 to the phase shifter 215. The auxiliary amplifier 223 input port is coupled to the output of the phase shifter 215, while the output 225 is coupled to the second input port 230b of the combiner 230. The output port 230c of the combiner 230 is coupled to the output port 232 of the RF power amplifier system 200 that can be suitably coupled to drive a desired load or an antenna (not shown).

Figure 8:
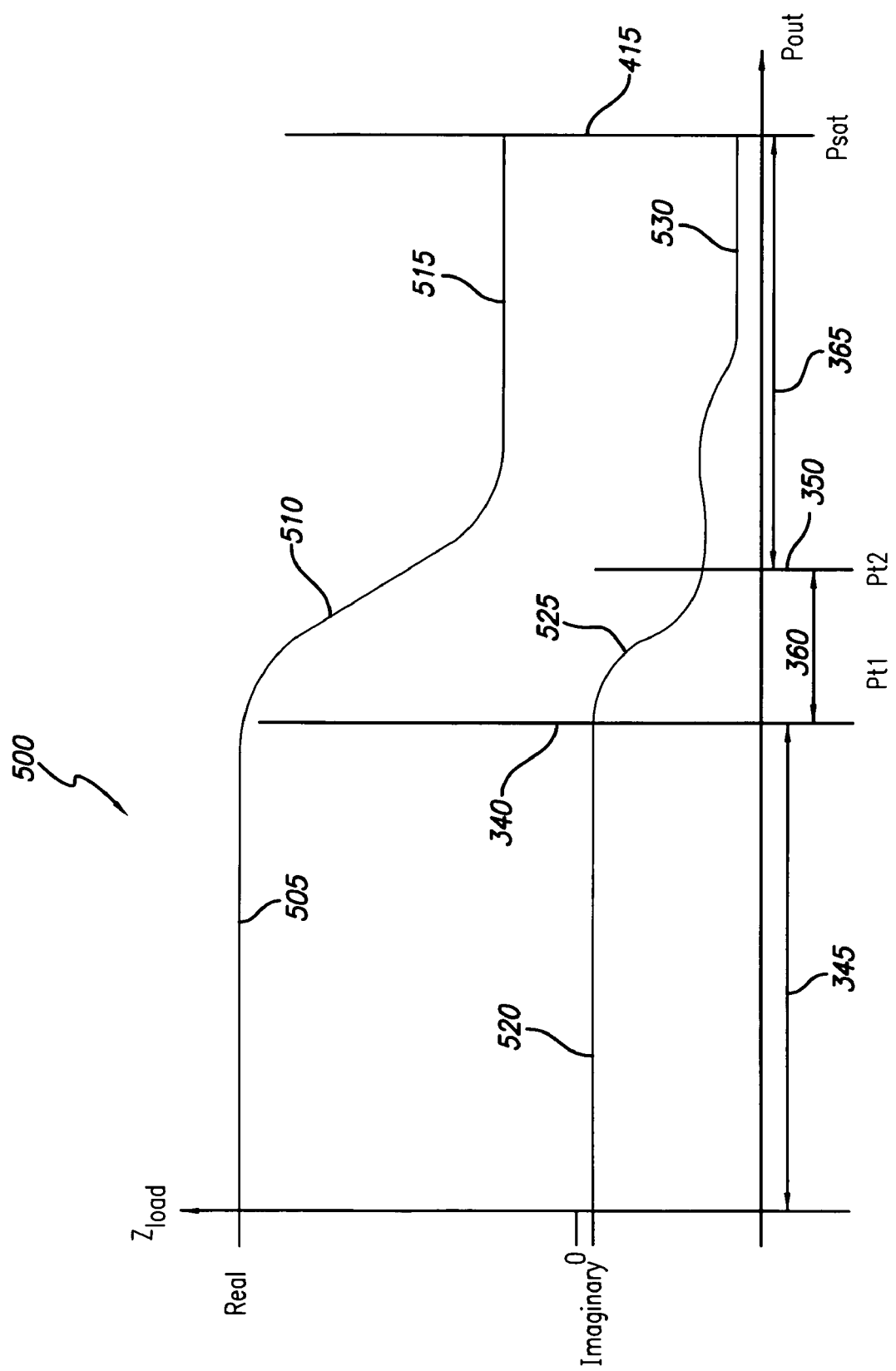
FIG. 8 is a graphical illustration of the load impedance presented to the output of the main amplifier module in the embodiment of FIG. 7.
Figure 9:
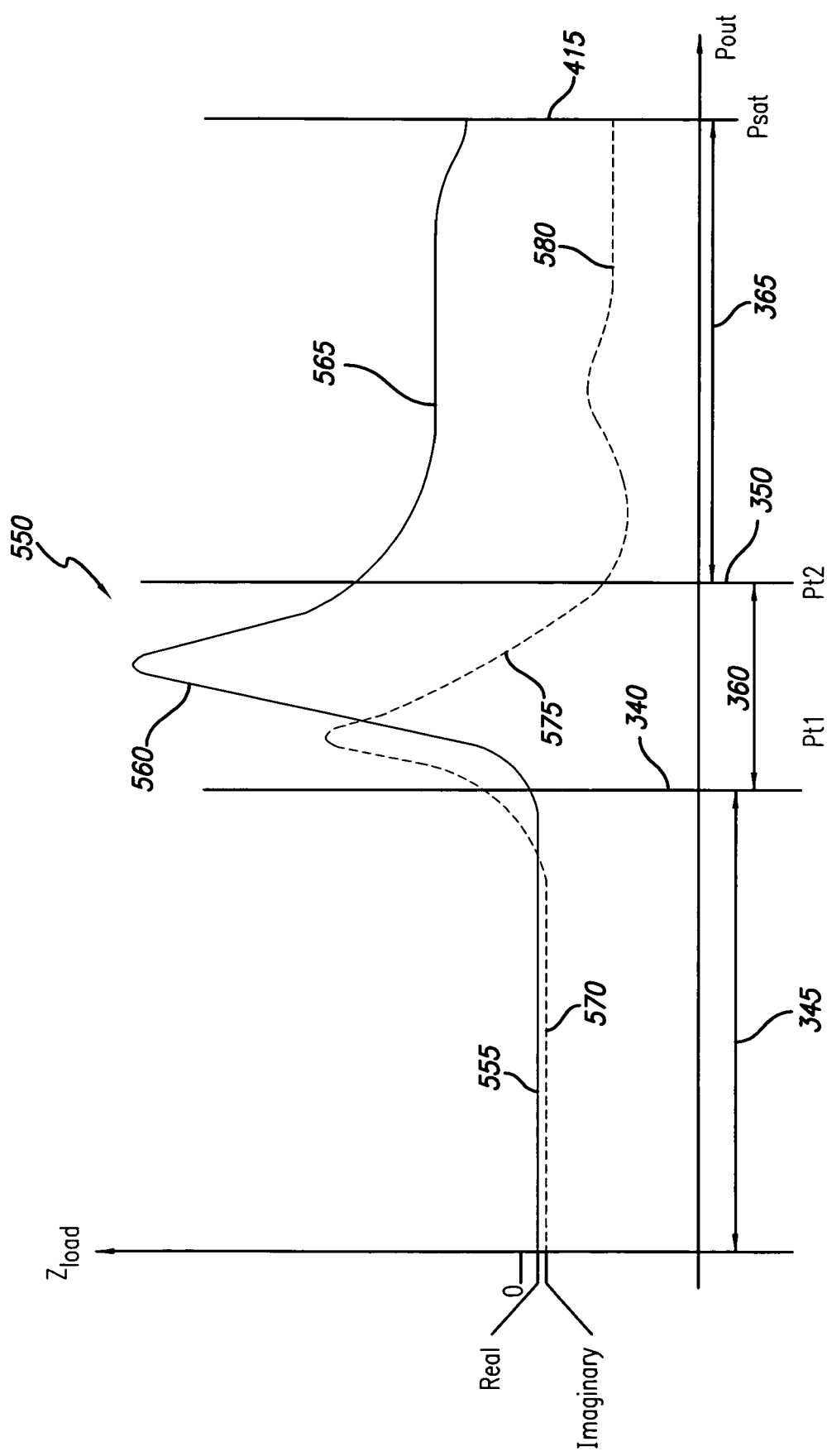
FIG. 9 is a graphical illustration of the load impedance presented to the output of the auxiliary amplifier module in the embodiment of FIG. 7.

Referring to FIG. 8 and FIG. 9 the dynamics of load variation with output signal level for main amplifier module 240 and auxiliary amplifier module 223 respectively are illustrated. FIG. 8 shows curves 500 for both real and imaginary load impedance for main amplifier 240. As shown the curves have different characteristics in three distinct power regions 345, 360 and 365. More specifically, the real part of the load impedance has a high level 505 at lower power region 345, and it transitions in transition region 510 from the higher level, as the signal level is increased and the load pulling is activated, to a lower level 515 in higher power region 365. The imaginary part of the load in turn is shown by curves 520, 525 and 530 for the three power regions 345, 360 and 365. In the auxiliary amplifier section, the load impedance presented to the output of the auxiliary amplifier module 223 is shown by curves 550 in FIG. 9. The load appears to be negative when the auxiliary amplifier 223 is inactive at curves 555, 570. This is indicative of the fact that this device absorbs very small RF power in this mode, but this loss of output power is outweighed by the improvements of main amplifier module 240 efficiency. As the input RF signal level is increased, auxiliary amplifier 223 is turned on and starts supplying current into the load 230b (FIG. 7). Beginning at the first intermediate output level, pt1 340, relatively large impedance is presented to the output of the auxiliary amplifier 223 (no current flow into the second input 230b of combiner 230 of FIG. 7), and at larger powers beginning at Pt2 350, the real portion of load impedance at second input 230b stabilizes in curve 565 at a value that is similar to value 515 (FIG. 8) presented to the output port 228 of the main amplifier 240 at the first input 230a of combiner 230 (FIG. 7). Further comparison of the two graphs presented in FIG. 8 and FIG. 9 shows that the load impedance presented to the output 228 of the main amplifier 240 is dynamically changed (reduced) to improve the linearity and prevent output clipping/distortion.

A preferred implementation of accurate conduction angle control is next described. Bias control is required to achieve appropriate amplitude transfer characteristics for auxiliary amplifier module 223. In particular, the phase response and group delay shift during conduction angle transition over the dynamic range of output power levels should be adequately addressed. The present invention addresses these issues with bias and phase control circuit 219 (FIG. 7 and FIG. 14) that is operative to generate a plurality of respectively different control signals based on the input envelope signal 213c.

Figure 10:
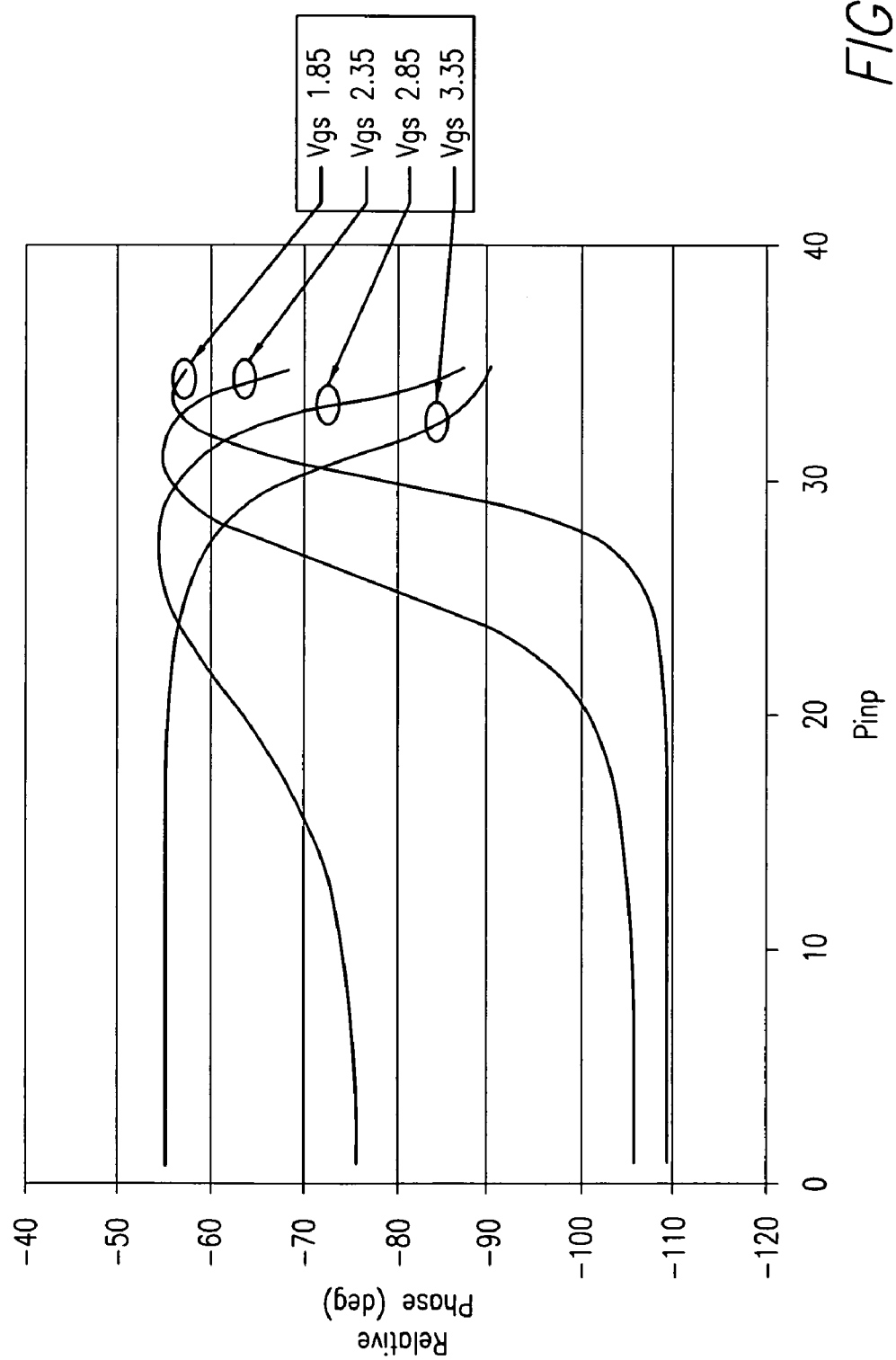
FIG. 10 is a graphical illustration of the auxiliary amplifier differential phase as a function of bias and input drive levels in the embodiment of FIG. 7.

The auxiliary amplifier dynamic phase behavior is illustrated in FIG. 10. The illustrated response and following discussion refers to LDMOS based amplifier devices used to exemplify basic principles employed in the present invention. Other device technologies, such as BJT, GaAs, InG and etc, as well as vacuum tubes can also be used in the present invention without altering basic scope of present invention. The inventors have concluded through a series of experiments that the instantaneous phase response of the auxiliary amplifier changes dynamically with instantaneous input signal levels and auxiliary device bias levels representative examples of which are shown in FIG. 10. For example, if the auxiliary amplifier bias voltage (Vgs) (line 221 in FIG. 7) is set to a fixed value of 1.85 Vdc the relative insertion phase of the auxiliary amplifier starts at about −110 degrees at small input drive levels $P_{inp}$, for example from 0 to about 25 dBm ($P_{inp}$) input drive level as shown. As $P_{inp}$ increases above 25 dBm the phase of the auxiliary amplifier changes rapidly from about −110 to −60 degrees within a narrow span of $P_{inp}$ in a range of about 25 to 32 dBm. As another example shown in FIG. 10, if the bias voltage (Vgs) is set to a fixed value of 2.85 Vdc the relative insertion phase of the auxiliary amplifier starts at about −75 degrees at small input drive levels $P_{inp}$, for example from 0 to approximately 15 dBm ($P_{inp}$) input drive level. Similarly, above about 15 dBm to about 28 dBm the phase response rises to about 55 degrees before descending rapidly to −85 degrees when the auxiliary amplifier is excited with a 35 dBm input signal. To further summarize the auxiliary amplifier insertion phase response is therefore a function of both bias voltage (221 in FIG. 7) and instantaneous input RF signal level (line 205 in FIG. 7). To address this phase variation a phase angle control signal on line 217 in FIG. 7 controls a phase shifter 215, which provides for phase normalization over the dynamic range of input RF drive levels. Insertion phase equalization between the main 240 and auxiliary 223 amplifier modules maximizes efficiency and peak power capability and reduces potential for intermodulation distortion achieving greater efficiency. Additional and substantially more accurate phase equalization can be achieved by applying an appropriate combination of control signals comprising conduction angle bias voltage 221 and by altering the phase of input RF signal 205 with phase shifter 215 by applying phase control signal 217.

Figure 11:
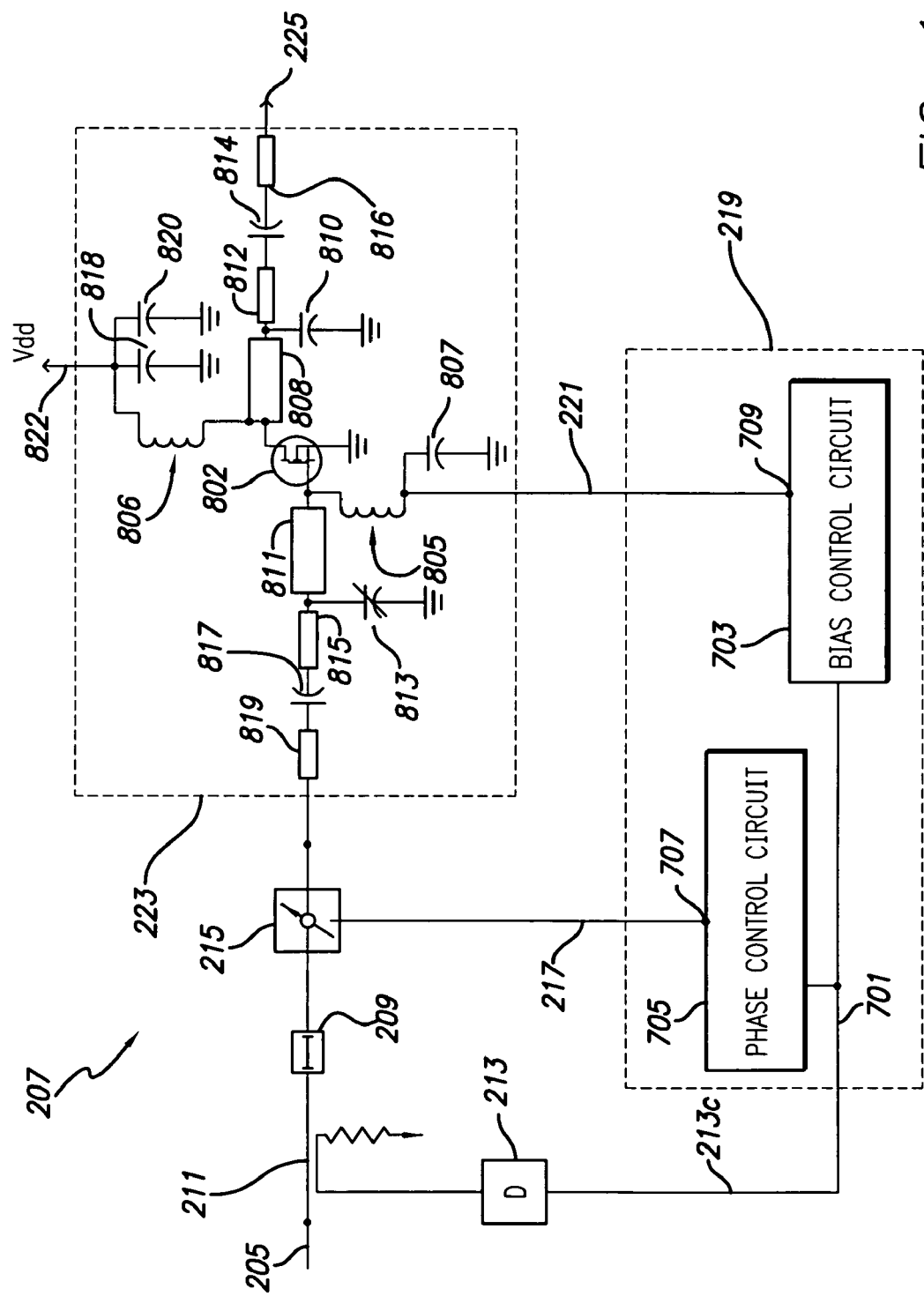
FIG. 11 is a schematic drawing illustrating the auxiliary amplifier of FIG. 7 in detail along with bias and phase control circuits showing interconnection detail.

Referring next to FIG. 11, a detailed embodiment of the auxiliary amplifier path 207 of FIG. 7 is shown. The input signal 205 is derived from input divider network 202 (shown in FIG. 7). A portion of input RF signal 205 is coupled off by the directional coupler 211. A through port of directional coupler 211 is coupled to the input port of the phase shifter 215 via delay 209. The output port of the phase shifter 215 is coupled to the input of the auxiliary amplifier module 223. The auxiliary amplifier module 223 presented in FIG. 11 employs a single stage, LDMOS transistor 802. As it is well known to those skilled in the art numerous implementations of microwave frequency power amplifier modules are possible, which are not limited to a single stage device and which also may employ alternative device technologies. Several manufacturers (Freescale Semiconductor, Philips, Agere, Infenion and others) offer RF power LDMOS devices having output power (P1 dB) in excess of 100 Watts which may be employed for device 802. As is conventional for high power amplifiers operating at microwave frequencies, input microstrip matching circuits (819, 815, 811) in conjunction with a shunt capacitor 813 are used to match a very low input LDMOS device impedance to a 50 Ohm input. A series, DC blocking capacitor 817 is used as a DC blocker to prevent the bias voltage on line 221 from being shorted by external elements. Similarly, the low output impedance of the LDMOS transistor 802 is transformed to a 50-Ohm impedance through a combination of series microstrip matching elements (808, 812 & 816) and shunt capacitor 810. A series DC blocking capacitor 814 prevents Vdd supply on line 822 from being shorted to outside elements connected to the output port 225. The output 225 of the auxiliary amplifier module 223 is coupled to the output combiner 230 (shown in FIG. 7). The drain supply voltage on line 822 (Vdd) is passed through a low resistance series inductor 806 before being coupled to the drain of the LDMOS transistor 802. Series inductor 806 is used in conjunction with bypass capacitors 818, 820 to keep RF signals from coupling through DC lines 822. Gate biasing of the LDMOS transistor 802 is supplied via line 221 through a low resistance inductor 805 in conjunction with RF bypass capacitor 807.

Still referring to FIG. 11, a sampled input RF signal is coupled to the input of the envelope detector circuit 213. An envelope signal 213c is output from detector 213 and provided to control circuit 219. Control circuit 219 employs two separate control circuits (705, 703) for phase and bias control, each circuit being responsive to the detected signal envelope on line 701. First control circuit 705 provides control signals 217 to the phase shifter 215, whereas second control circuit 703 provides bias voltage signals on line 221 to the LDMOS transistor 802. Each control circuit (705, 703) allows fully autonomous control over phase and bias levels in the auxiliary amplifier, respectively.

Figure 12:
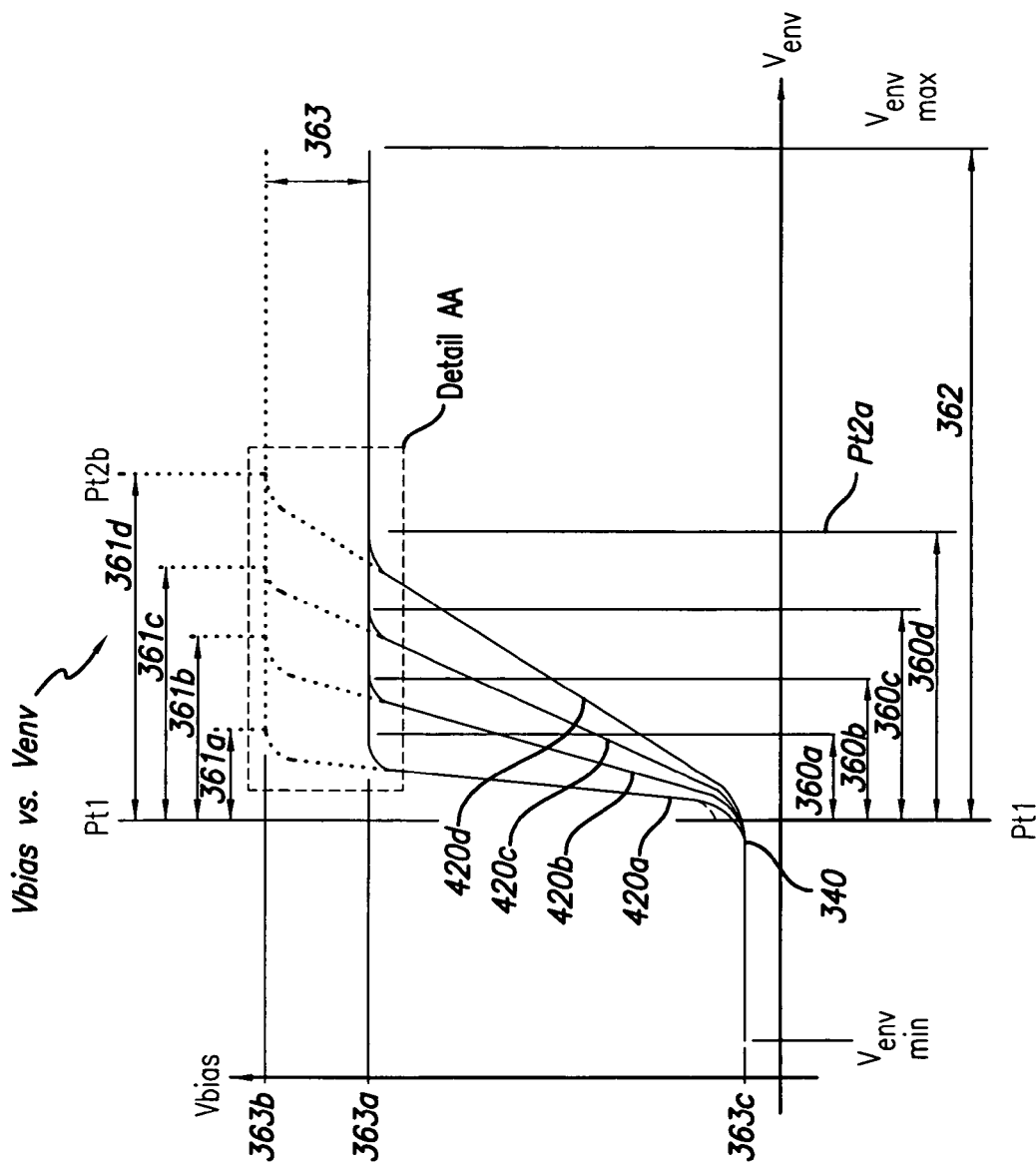
FIG. 12 is a graphical illustration of the auxiliary amplifier Vbias vs. Venv over various slope and operating temperature ranges with a set bias break point Pt1.

Dynamic operation of the bias control circuit 703 is illustrated in FIG. 12. Bias circuit 703 is designed to operate over a wide range of operating temperatures. Under normal operating conditions temperature variation must be taken into account and bias control circuit 703 preferably provides temperature compensated bias voltage Vbias (221) as a function of operating temperature. In FIG. 12 Vbias at the highest possible operating temperature is set at level 363b while the lowest possible operating temperature corresponds to level 363a. Analog control circuit 703 (shown in detail in FIG. 14) provides a continuously variable bias voltage in the range between high and low temperature levels in the overall range 363. Additionally, the transitional bias slope (420a-d) from Class C mode to Class AB/B is controlled based on LDMOS device specifics to allow the best possible efficiency and highest saturated peak power. The present invention improves performance by keeping auxiliary amplifier 223 section in true Class-C bias mode until a predetermined threshold point Pt1 (FIG. 12) when auxiliary amplifier 223 is allowed to transition from Class-C bias to Class-AB/B bias mode Pt2. The transition permits the auxiliary amplifier to utilize its maximum gain and peak power capability since both gain and peak power are greater in Class AB/B mode than Class C mode. Bias control 703 circuit allows precise control of the auxiliary amplifier section bias state.

To facilitate understanding and further clarify control aspects employed in the present invention the following terminology will be employed:

Class C bias operation:

$$V_{bias}=V_{363c} \text{ when } Venv_{min} \leq Venv \leq Venv_{Pt1}$$

Instantaneous Envelope Transitional Bias State:

$$V_{363c} \leq V_{bias} \leq V_{363a,b} \text{ when } Venv_{Pt1} \leq Venv \leq Venv_{Pt2}$$

Class AB/B bias operation:

$$V_{bias}=V_{363a,b} \text{ when } Venv_{Pt2} \leq Venv \leq Venv_{max}$$

For example, instantaneous envelope transitional bias state occurs between Class C state Pt1 to Class AB/B state Pt2 and can be shifted 362 relative to maximum envelope voltage $Venv_{max}$.

Figure 15:
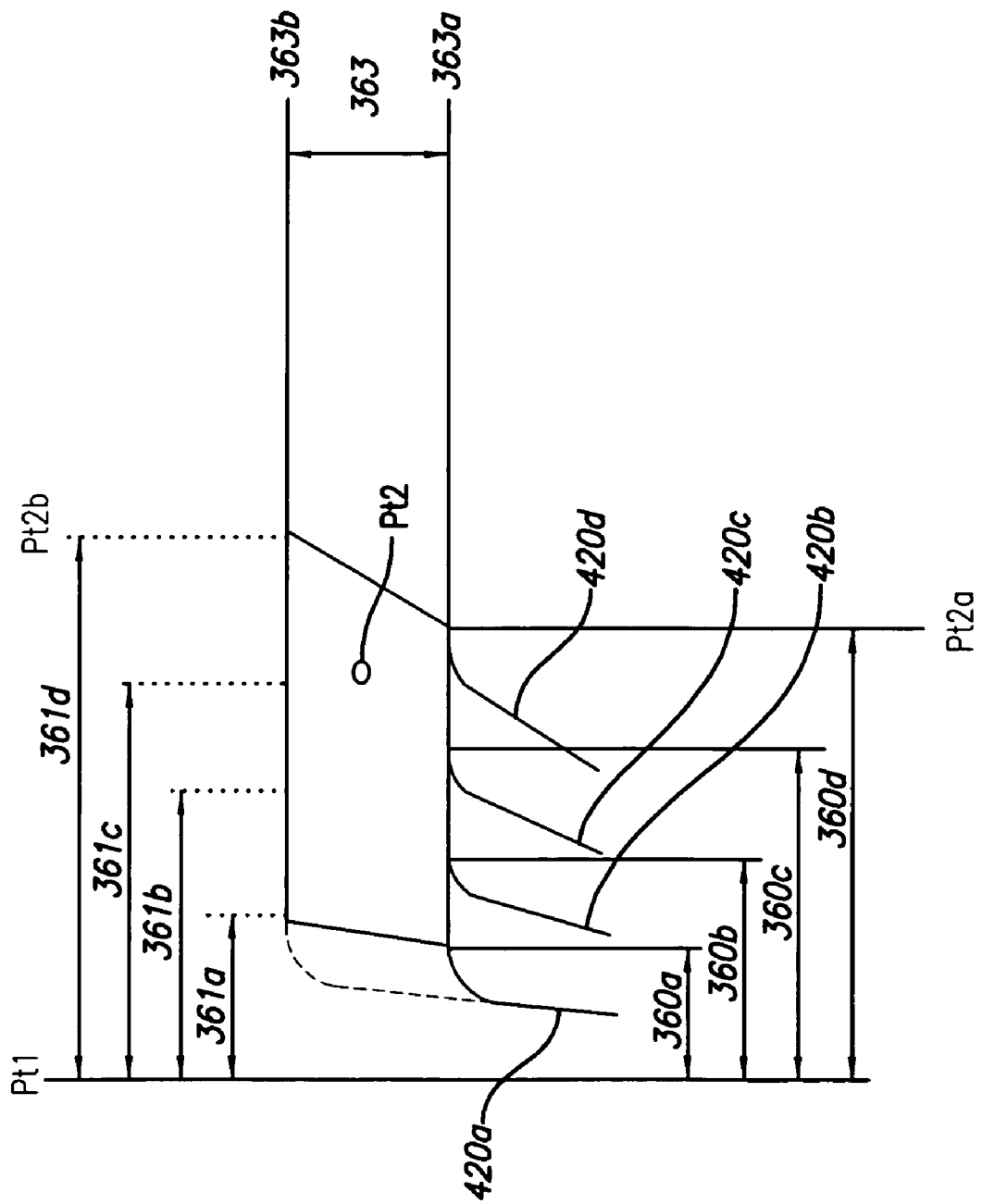
FIG. 15 is a graphical illustration of the auxiliary amplifier Vbias vs. Venv Class-AB/B commencement point, Detail M.

Referring to FIG. 12 Class AB/B operation inception occurs once Venv level exceeds Pt2 voltage level. Class AB/B operation inception point is a continuous function of Venv and operating temperature and thus can occur anywhere in the area bounded by temperature bias voltage limits (363b & 363a) and transitional bias slope intercepts 361a to 361d to 360d to 360a-Detail AA, see FIG. 15. For example, if a transitional bias state is set to operate on slope 420b Class AB/B operation inception point Pt2 will move as function of operating temperature on the curve defined by low temperature intercept 363a & 360b and high temperature intercept 363b & 361b-dotted line. Due to a transitional bias slope variation (420a-d) the above mentioned maximum 363b and minimum 363a temperature to slope (420a-d) intercept pairs will shift accordingly relative to Venv.

The starting Class AB/B bias point Pt2 can be shifted relative to Class C termination point Pt1. As described herein, Class AB/B bias voltage level is also a function of temperature and bounded by maximum 363b and minimum 363a bias voltages available on bias control line 221 supplying gate of LDMOS transistor 802 in Class AB/B bias. Gate bias voltage transition from Class C to Class AB/B (420a-d) slope can be adjusted to achieve a best combination between overall efficiency, peak power, and linearity. Slope variation (420a-d) is accomplished by varying slope resistor 958, FIG. 14. Discrete slope lines (420a-d) are shown to exemplify basic control aspects of present invention. It shall be understood that slope adjustment range is continuous and shown as discrete lines (420a-d) only to exemplify control aspects in present invention.

Figure 13:
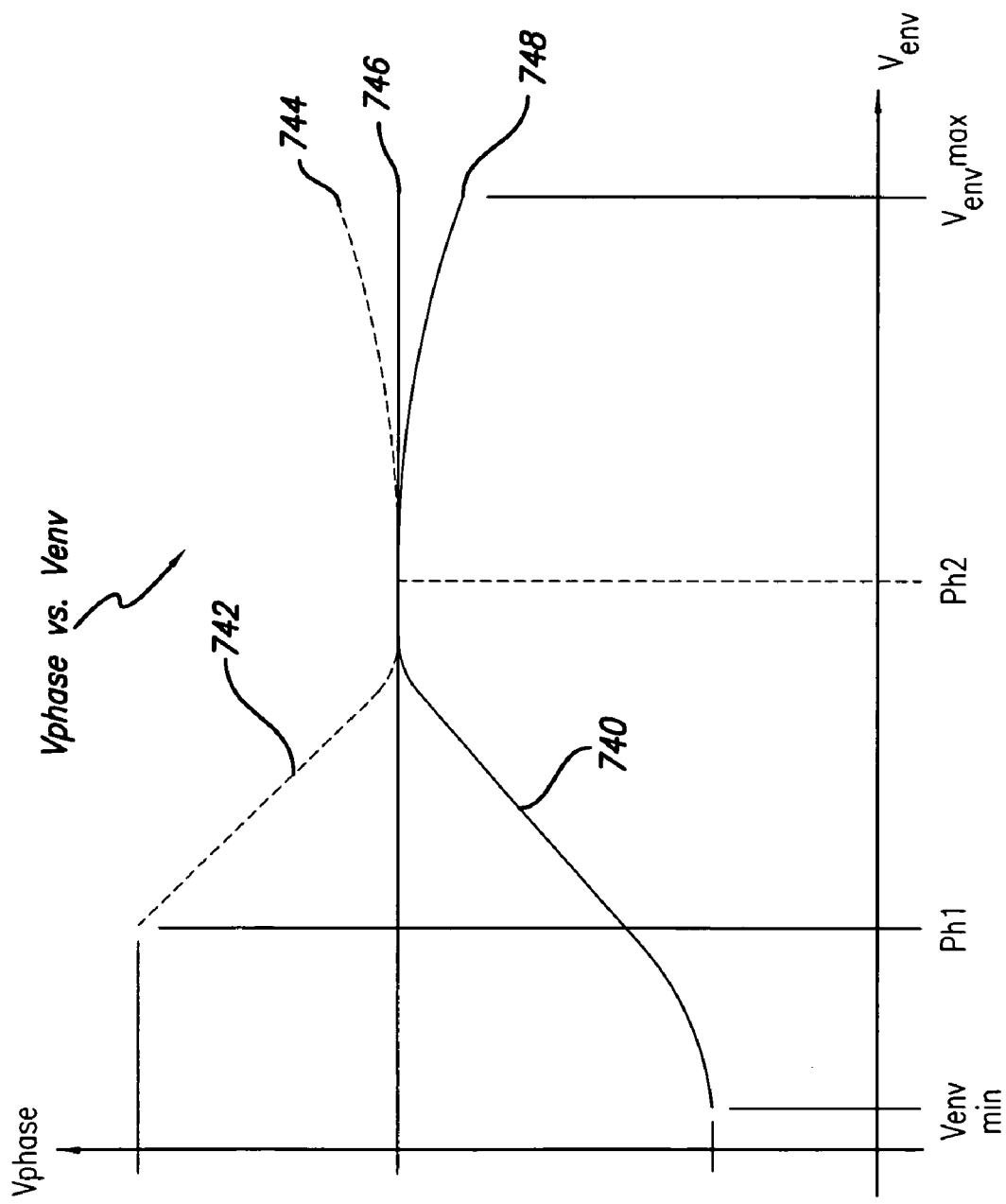
FIG. 13 is a graphical illustration of the auxiliary amplifier Vphase vs. Venv with a set bias break point Pt1 (240) showing phase linearization.
Figure 14:
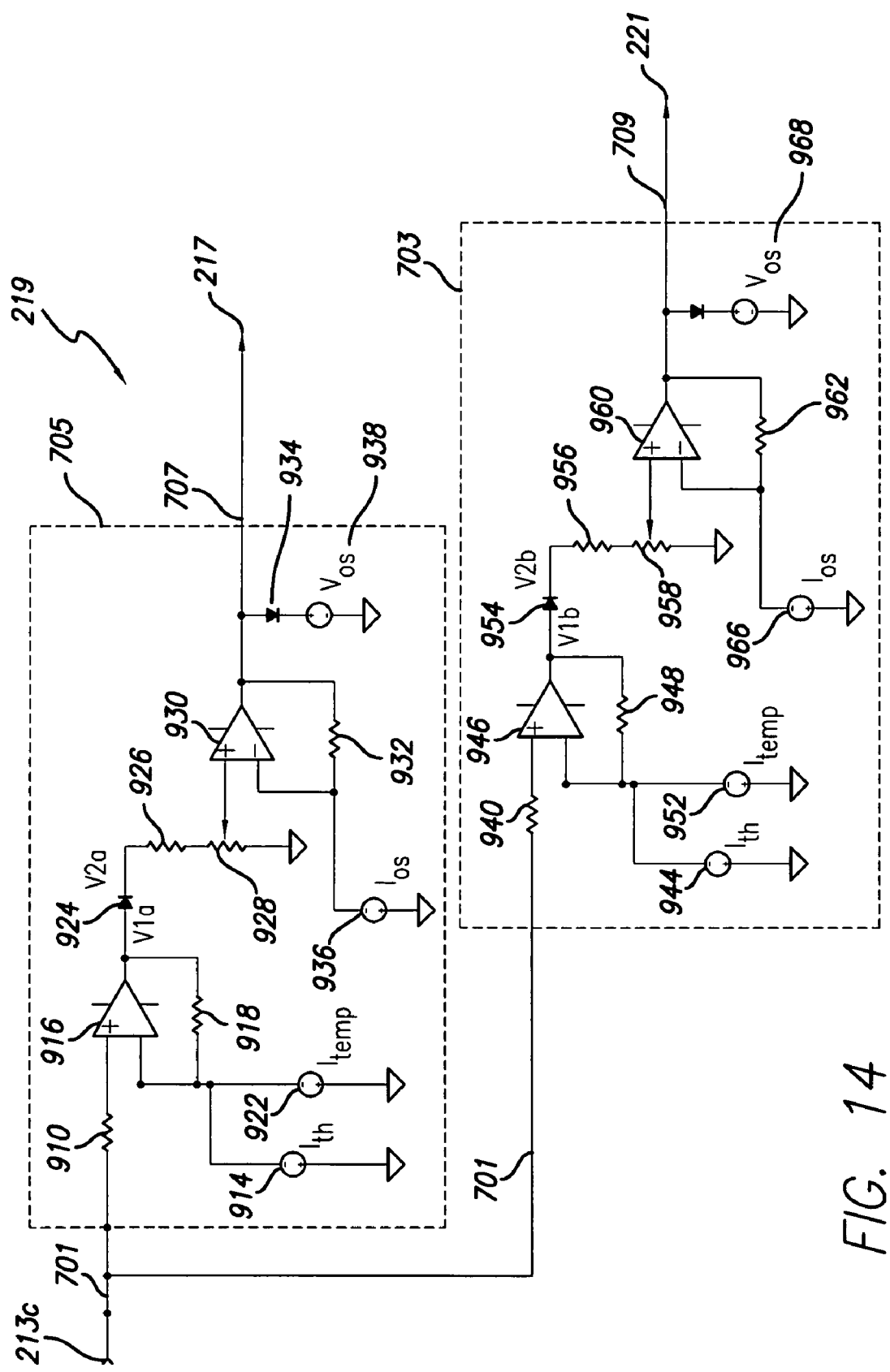
FIG. 14 is a schematic drawing illustrating the control circuit in detail showing control element implementation in a preferred implementation of the auxiliary amplifier module in the embodiment of FIG. 7.

With particular reference to FIG. 13 a phase response (740-748) vs. Venv for the LDMOS transistor 802 in the auxiliary amplifier 223 is presented. The present invention addresses rapid phase change 740 due to device bias transitioning between Class C and Class AB/B bias by employing phase control circuit 705 (FIGS. 11 and 14). Class C phase response at small signal levels ($Venv_{min}$ to Ph1) is substantially different from a Class AB/B biased amplifier, however, at these power levels the auxiliary amplifier 223 contribution to the output signal power 232 is insignificant. However, transition between Class C and Class AB/B can create a nonlinear combination of the output signals 225 from auxiliary amplifier 223 and 228 from main amplifier 240. This non-coherent phase signal addition leads to additional intermodulation distortion. The present invention reduces non-coherent phase signal addition during the transitional bias state:

$$Ph1 \leq V_{env} \leq Ph2$$

by actively controlling insertion phase response with a suitable phase shifter 215 responsive to phase control circuit 705. It should be noted that a certain degree of adjustment controllability is afforded by the present invention by allowing decoupling relation between Ph1 to Pt1 and Ph2 to Pt2. This four dimensional adjustability allows for precise adjustment during the transitional bias state. In practice, Ph1 to Pt1 and Ph2 to Pt2 can be coupled to reduce adjustment flexibility in order to simplify adjustability. Additional insertion phase compensation may be applied once auxiliary amplifier 223 is operating in Class AB/B mode so as to achieve the best possible peak output power level. Phase variation 740 during the transitional bias state (Ph1 to Ph2) can be adequately compensated by applying corresponding compensation phase shift 742 by applying suitable control voltage 217 to phase shifter 215 (FIG. 11). Once auxiliary amplifier 223 is operating in Class AB/B mode phase compensation 744 is added to further compensate for nonlinear phase response during Class-AB/B operation (Ph2 to Venv$_{max}$). The resulting stabilized phase is shown by line 746.

Referring to FIG. 14 a detailed embodiment of phase control circuit 705 and gate bias control circuit 703 is shown. Input RF signal detected envelope signal (Venv) 213c is delivered along line 701 to the respective control circuits input terminals (terminals are shown by resistors, R910 and R940). The two control circuits (705 & 703) can be identical, except for control settings that govern respective control circuit outputs (707 & 709). Phase control circuit 705 output voltage 217 function can be written in the following form:

$$V_{707} = V_{2a} \frac{\alpha * R_{928}}{R_{928} + R_{926}} + I_{936} * R_{932} \text{ where } 0 < \alpha \leq 1$$

Where: α is wiper position on the R928 and controls slope of the compensation phase during transitional bias state (Ph1 to Ph2)

$$V_{2a} = \left\{ \frac{0, (V_{1a} \leq 0.7 \text{ V})}{V_{1a} - 0.7, (V_{1a} > 0.7)} \right\}$$

$$V_{1a} = V_{env} + I_{914} * R_{918} + I_{922} * R_{918}$$

and where: current source 1922 is used to control the amount of compensation phase over the operating temperature range; current source 1914 is used to control the amount of compensation phase at threshold point (Ph1) when compensating phase commences in relation to Venv value; and current source 1936 is used to control the initial phase shift control voltage 217 applied to phase shifter 215. Control voltage 217 will saturate to an upper level 363 when the voltage exceeds the controlled voltage source 938 by 0.7V. The voltage source 938 can be temperature compensated to set the appropriate threshold between 363a and 363b. The remaining circuit elements 916, 918, 924, 930, 932, and 934 are conventional components with function corresponding to the standard electrical schematic symbol.

A similar function can be written for gate control circuit 703 output voltage 221 function:

$$V_{709} = V_{2b} \frac{\alpha * R_{958}}{R_{958} + R_{956}} + I_{966} * R_{962} \text{ where } 0 < \alpha \leq 1$$

Where α is wiper position on the R958 and controls slope (420a-d) of the gate bias 221 voltage during transitional bias state (Pt1 to Pt2)

$$V_{2b} = \left\{ \frac{0, (V_{1b} \leq 0.7 \text{ V})}{V_{1b} - 0.7, (Vb_{1b} > 0.7)} \right\}$$

where:

$$V_{1b} = V_{env} + I_{944} * R_{948} + I_{952} * R_{948}$$

and where: current source 1952 is used to control Class AB/B bias amount of gate bias over operating temperature range 363; current source 1944 is used to set threshold point Pt1 when the transitional bias state commences in relation to Venv value; and current source 1966 is used to set initial gate bias voltage 221 in Class C operation (note that gate voltage 221 can be negative to keep LDMOS transistor 802 in Class C). Control voltage 221 will saturate to an upper level that can be set separately using the controlled voltage source 968. It shall be understood that the above disclosed current sources can be replaced with voltage sources and the voltage sources with current sources. Furthermore, these voltage sources can be static such as a voltage derived from a voltage reference or dynamically altered by a microprocessor or DSP controller depending on operational requirements. The remaining circuit elements 946, 948, 954, 960, 962, and 964 may be conventional circuit elements.

The foregoing embodiments of the present invention provide a number of features and advantages. A novel and improved extended dynamic range power RF amplifier has been described that employs high-speed transfer functions to provide highly efficient and linear operation not otherwise possible from conventional techniques. The amplifier circuit may employ a linear Class AB or B power amplifier module operating into a suitable variable load power combiner network. In a conventional Class AB or B biasing the high linearity amplifier module exhibits good efficiency at powers levels approaching saturation levels. At these high power levels however linearity will not meet most applications due to regulatory requirements placed on such applications. To address this, the present invention dynamically and advantageously controls load impedance presented to the amplifier module. The load impedance is adjusted depending on input power levels in order to achieve linear operation while providing efficient operation.

The present invention also allows for efficient power combining while providing load impedance control for a main module through implementation of gate bias and phase shifter control functions. The present invention allows for precise control of the auxiliary amplifier module operating aspects, thus allowing for accurate control of load impedance and improved power combining.

More specifically, preferred embodiments have been described of a power amplifier arrangement employing a linear Class AB or B power module (main module) operating into a low loss dynamic impedance converter/power combiner network together with a variable bias auxiliary amplifier module wherein the load impedance presented to the main module is dynamically adjusted by the operation of the auxiliary amplifier module by providing the following control: active device conduction angle transition control in the auxiliary amplifier module from Class C to Class AB/B as a function of input RF signal envelope—with the starting point a complex function of the input signal envelope; the rate of change of conduction angle is controlled as a function of input RF signal envelope level applied to input of auxiliary amplifier module; the auxiliary amplifier module insertion phase response is controlled in order to provide the best possible power combining of signals amplified by the main amplifier module and auxiliary amplifier module across the output power range of power levels; and temperature compensation of the bias level of the auxiliary amplifier is controlled as a complex function of the input envelope. These and other aspects of present invention provide an amplification arrangement that yields substantial improvement in efficiency while attaining adequate linearity.

The foregoing descriptions of preferred embodiments of the invention are purely illustrative and are not meant to be limiting in nature. Those skilled in the art will appreciate that a variety of modifications are possible while remaining within the scope of the present invention.

What is claimed is:

1. A power amplifier circuit, comprising:
an input for receiving an input signal;
a coupler for receiving the input signal and splitting the input signal on two signal paths;
a first amplifier device coupled to the coupler on a first of the two signal paths and receiving the input signal and providing a first amplified signal, said first amplifier device having a first turn on threshold;
a second amplifier device coupled to the coupler on a second of the two signal paths and receiving the input signal and providing a second amplified signal, said second amplifier device having a second turn on threshold and an impedance near zero when said input signal is below said second turn on threshold;
an output load coupled to said first and second amplifier devices;
a DC power supply;
a first bias circuit coupled to the first amplifier device and the DC power supply and providing a first bias to the first amplifier device setting the first turn on threshold of said first amplifier device;
bias control means, coupled to the second amplifier device and the DC power supply, for providing a second bias to the second amplifier device setting the second turn on threshold of said second amplifier device at a substantially higher level than said first turn on threshold, said second turn on threshold corresponding to a peak power region of the input signal; and
an output coupled to the first and second amplifier devices via said output load and providing an amplified output signal.

2. A power amplifier circuit as set out in claim 1, wherein said bias control means controls the second bias through a bias class transition of the second amplifier device from Class C to Class AB/B.

3. A power amplifier circuit as set out in claim 2, wherein said bias control means is adjustable to control the rate of change of conduction angle of said second amplifier device.

4. A power amplifier circuit as set out in claim 1, wherein said bias control means controls the second bias to the second amplifier device as a function of temperature.

5. A power amplifier circuit as set out in claim 2, wherein said bias control means controls the bias class transition point of the second amplifier device as a function of temperature.

6. A power amplifier circuit as set out in claim 2, further comprising phase control means coupled between said input and said second amplifier device for controlling phase of the input signal in response to the input signal envelope.

7. A power amplifier circuit as set out in claim 6, wherein said phase control means provides a first direction of phase adjustment in a first input signal envelope power region and a second opposite direction of phase adjustment in a second input signal envelope power region.

8. A power amplifier circuit as set out in claim 7, wherein said phase control means compensates for phase variation introduced by said bias control means.

9. A radio frequency power amplifier system comprising:
an RF input port for receiving an RF input signal;
an RF output port for providing an amplified output signal in response to said input signal;
a power divider network having an input port coupled to the RF input port and first and second output ports;
a first signal delay element having an input port coupled to the first output port of said power divider network and an output port;
a first amplifier having an input port coupled to the output port of said delay element and an output port;
a directional coupler having a first interconnection port coupled to the second output port of said power divider network and a second interconnection port and a third interconnection port;
a continuously variable phase shifter for controlling insertion phase, said phase shifter having an input port coupled to the second interconnection port of said directional coupler and an output port;
a second amplifier having an input port coupled to the output port of said phase shifter;
a linear envelope detector network having an input port coupled to the third interconnection port of the said directional coupler and an output port, wherein said envelope detector output port provides signals responsive to the envelope of the input RF signal;
conduction angle control means, having at least one input port and a plurality of output ports, for generating a plurality of different conduction angle control functions, wherein said conduction angle control functions are responsive to the RF signal envelope applied to said RF power amplifier; and
a dynamic signal combiner network having first and second input ports and an output port, wherein the output port of said first amplifier is coupled to the first input port of the dynamic signal combiner network, the output port of said second amplifier is coupled to the second input port of the dynamic signal combiner network, and the output port of said signal combiner network is coupled to the RF output port.

10. A radio frequency power amplifier system as set out in claim 9, wherein said phase shifter is responsive to a first output port of said conduction angle control means, wherein said first output provides an insertion phase control signal.

11. A radio frequency power amplifier system as set out in claim 9, wherein a second output of said conduction angle control means is functionally coupled to control the bias of said second amplifier.

12. A radio frequency power amplifier as set out in claim 9, wherein said first amplifier is a main RF power amplifier.

13. A radio frequency power amplifier as set out in claim 9, wherein said second amplifier is an auxiliary RF power amplifier.

14. A radio frequency power amplifier as set out in claim 9, wherein said conduction angle control means provides said control signals as a function of temperature.

15. A method for linear and efficient amplification of an RF input signal, comprising the steps of:
receiving an RF input signal having an input signal power range;
sampling the input signal to provide a sampled input signal;
amplifying the input signal with a first amplifier device and applying the amplified signal across a load to provide an output signal;
amplifying the sampled input signal with a second amplifier device and applying the amplified sampled input signal to the output load in parallel with said amplified signal; and
dynamically varying the impedance of said second amplifier device from a first substantially constant impedance near zero value over the lower major portion of the input signal power range to a second impedance having a higher value than said first impedance in a peak power range of the input signal to substantially reduce the load of the first amplifier device when the input signal approaches the peak power range while maintaining the load substantially constant over the lower major portion of the input signal power range.

16. A method for linear and efficient amplification of an RF input signal as set out in claim 15, wherein dynamically varying the impedance of said second amplifier device comprises dynamically varying a bias class of said second amplifier device from a first bias class in a lower portion of the input signal power range to a second bias class in a higher power range of the input signal.

17. A method for linear and efficient amplification of an RF input signal as set out in claim 16, wherein said first bias class is Class C and said second bias class is Class AB or B.

18. A method for linear and efficient amplification of an RF input signal as set out in claim 16, wherein the a transition between said first and second bias class is controlled as a function of temperature.

19. A method for linear and efficient amplification of an RF input signal as set out in claim 16, further comprising controlling the a phase of the input signal as a function of input signal power.

* * * * *